United States Patent
Yang et al.

(10) Patent No.: US 7,555,690 B1
(45) Date of Patent: Jun. 30, 2009

(54) DEVICE FOR AND METHOD OF COUPLING TEST SIGNALS TO A DEVICE UNDER TEST

(75) Inventors: Yi-Ning Yang, Cupertino, CA (US); Arthur H. Khu, San Mateo, CA (US); Jin-Feng Chou, Los Altos, CA (US); Paul T. Nguyen, Fremont, CA (US)

(73) Assignee: XILINX, Inc., San Jose, CA (US)

( * ) Notice: Subject to any disclaimer, the term of this patent is extended or adjusted under 35 U.S.C. 154(b) by 214 days.

(21) Appl. No.: 11/021,780

(22) Filed: Dec. 23, 2004

(51) Int. Cl.
  *G01R 31/28* (2006.01)
(52) U.S. Cl. .................................. 714/742; 714/718
(58) Field of Classification Search ................. None
  See application file for complete search history.

(56) References Cited

U.S. PATENT DOCUMENTS

| | | | |
|---|---|---|---|
| 4,441,183 A * | 4/1984 | Dussault ................. 714/732 |
| 4,730,348 A * | 3/1988 | MacCrisken ............. 375/240 |
| 4,876,541 A * | 10/1989 | Storer .................... 341/51 |
| 5,010,533 A * | 4/1991 | Scheller et al. ........... 714/751 |
| 5,333,277 A * | 7/1994 | Searls .................... 710/300 |
| 5,396,595 A * | 3/1995 | Standley ................. 710/68 |
| 5,481,701 A * | 1/1996 | Chambers, IV ........... 707/101 |
| 5,787,270 A * | 7/1998 | Bloomer et al. ............ 714/8 |
| 6,028,439 A * | 2/2000 | Arkin et al. .............. 324/765 |
| 6,127,953 A * | 10/2000 | Manzardo ................ 341/87 |
| 6,324,485 B1 * | 11/2001 | Ellis .................... 702/117 |
| 6,661,839 B1 * | 12/2003 | Ishida et al. ............. 375/240 |
| 6,728,901 B1 * | 4/2004 | Rajski et al. .............. 714/30 |
| 6,732,312 B2 * | 5/2004 | Khoche et al. ........... 714/738 |
| 6,754,866 B1 | 6/2004 | Ong |
| 6,812,726 B1 | 11/2004 | Ong |
| 6,882,171 B2 | 4/2005 | Ong |
| 7,006,940 B1 | 2/2006 | Ong |
| 7,103,815 B2 | 9/2006 | Ong |
| 7,139,945 B2 | 11/2006 | Ong |
| 7,245,141 B2 | 7/2007 | Ong |
| 7,259,582 B2 | 8/2007 | Ong |
| 7,265,570 B2 | 9/2007 | Ong |
| 7,313,740 B2 | 12/2007 | Ong |
| 2001/0013110 A1 * | 8/2001 | Pierce et al. ............. 714/718 |
| 2001/0015924 A1 * | 8/2001 | Arimoto et al. ........... 365/201 |
| 2001/0054166 A1 * | 12/2001 | Fukuda .................. 714/733 |
| 2002/0012283 A1 * | 1/2002 | Ernst et al. .............. 365/201 |
| 2002/0157052 A1 * | 10/2002 | Ernst et al. .............. 714/738 |
| 2003/0167144 A1 * | 9/2003 | Wang et al. .............. 702/119 |
| 2003/0233604 A1 * | 12/2003 | Lin et al. ................. 714/718 |
| 2004/0019841 A1 | 1/2004 | Ong |
| 2004/0061560 A1 * | 4/2004 | Kwon et al. ............. 331/53 |

(Continued)

*Primary Examiner*—John P Trimmings
*Assistant Examiner*—Steven D Radosevich
(74) *Attorney, Agent, or Firm*—John J. King (57) ABSTRACT

Various embodiments of the present invention relate to a device for testing an integrated circuit. According to one embodiment, the device comprises a first connector coupled to receive a device under test and a second connector coupled to receive compressed test data by way of test equipment. The device also comprises a decompressor coupled to receive compressed test data, and provided decompressed test data to the device under test. Embodiments implementing two different clocks to improve the speed of testing integrated circuits are also disclosed. Various methods for coupling test signals to a device under test are also disclosed.

13 Claims, 5 Drawing Sheets

U.S. PATENT DOCUMENTS

| | | | |
|---|---|---|---|
| 2004/0083412 A1* | 4/2004 | Corbin et al. | 714/726 |
| 2004/0093443 A1* | 5/2004 | Lee et al. | 710/53 |
| 2004/0107395 A1* | 6/2004 | Volkerink et al. | 714/732 |
| 2004/0117710 A1* | 6/2004 | Patil et al. | 714/739 |
| 2004/0193805 A1* | 9/2004 | Au et al. | 711/131 |
| 2004/0205437 A1* | 10/2004 | Yao et al. | 714/742 |
| 2004/0217791 A1* | 11/2004 | Konuk et al. | 327/165 |
| 2005/0251359 A1* | 11/2005 | Cao et al. | 702/120 |
| 2005/0289428 A1 | 12/2005 | Ong | |
| 2006/0075317 A1* | 4/2006 | Chindamo et al. | 714/726 |
| 2006/0242502 A1* | 10/2006 | Wang et al. | 714/724 |
| 2007/0011542 A1* | 1/2007 | Mukherjee et al. | 714/738 |
| 2007/0067687 A1* | 3/2007 | Ong | 714/731 |
| 2007/0094555 A1 | 4/2007 | Ong | |
| 2007/0168808 A1 | 7/2007 | Ong | |

* cited by examiner

DEVICE FOR AND METHOD OF COUPLING TEST SIGNALS TO A DEVICE UNDER TEST

FIELD OF THE INVENTION

The present invention relates generally to testing integrated circuits, and in particular, to a device for and method of coupling test signals to a device under test.

BACKGROUND OF THE INVENTION

Test equipment typically has a finite amount of internal memory, also called scan memory, in which to hold test patterns for a device under test (DUT). The maximum number of test patterns which will fit into scan memory are loaded at the beginning of a test operation, and then the test equipment applies the test patterns to one or more devices mounted on the test equipment. Device test coverage is increased with the application of more test patterns, while the time and cost required to test the device is decreased, when the test equipment applies the test patterns at a faster rate.

One group of integrated circuits which benefits from testing is programmable logic devices (PLDs), such as field programmable gate arrays (FPGAs) or complex programmable logic devices (CPLDs). Test programs for FPGAs typically consist of many paired test patterns: one to configure the FPGA, and another to test the functionality of the FPGA after configuration. Process technology improvements have led to denser and larger FPGAs, which has resulted in larger FPGA configuration patterns. However, these larger configuration test patterns for higher density FPGAs lead to longer test pattern load times and lower test coverage, because fewer test patterns can fit into scan memory. Further, while shorter test times can be achieved by providing test data to the device under test at a faster rate, the ability to apply the test data at a faster rate is limited by the design of the test equipment.

Accordingly, there is a need for an improved device and method of coupling test signals to a device under test which provides a more efficient use of memory and overcomes processing limitations of test equipment.

SUMMARY OF THE INVENTION

The various embodiments of the present invention relate to a device for testing an integrated circuit. According to one embodiment, the device comprises a first connector coupled to receive a device under test; a second connector coupled to receive compressed test data by way of test equipment. The device also comprises a decompressor coupled to receive compressed test data, and provide the decompressed test data to the device under test. Embodiments implementing two different clocks to improve the speed of testing integrated circuits are also disclosed.

According to another embodiment of the present invention, a device for testing an integrated circuit comprises test equipment generating or receiving compressed test data. The test equipment is also adapted to receive a device under test. A decompressor associated with the test equipment is coupled to receive the compressed test data, and output decompressed data, based upon the compressed data, to the device under test. The decompressor could be integrated with the test equipment, or could be an attachment to the test equipment and adapted to receive the device under test and provide an interface between the device under test and the test equipment.

Various methods of coupling test signals to a device under test are also disclosed. According to one embodiment, a method comprises steps of receiving compressed test data; decompressing the compressed test data; applying the decompressed test data to the device under test; and detecting an output from the device under test. Various methods of generating compressed test patterns and increasing the operating speed of test equipment are also disclosed.

DETAILED DESCRIPTION OF THE DRAWINGS

The embodiments of the present invention improve test coverage of a device under test, such as an integrated circuit (IC) including a programmable logic device, by supporting the compression of test patterns. Compressing test patterns effectively allows more test patterns to fit into the same amount of scan memory. Embodiments of the invention also improve test times by running the decompressor at a faster clock rate than the clock rate used for the test equipment, and sending decompressed data to the device under test at the faster clock rate. As will be described in more detail below, the benefits of increasing the number of test patterns and increasing the testing rate are obtained according to many embodiments of the present invention without adding more scan memory or using test equipment with a faster clock rate.

Figure 1:
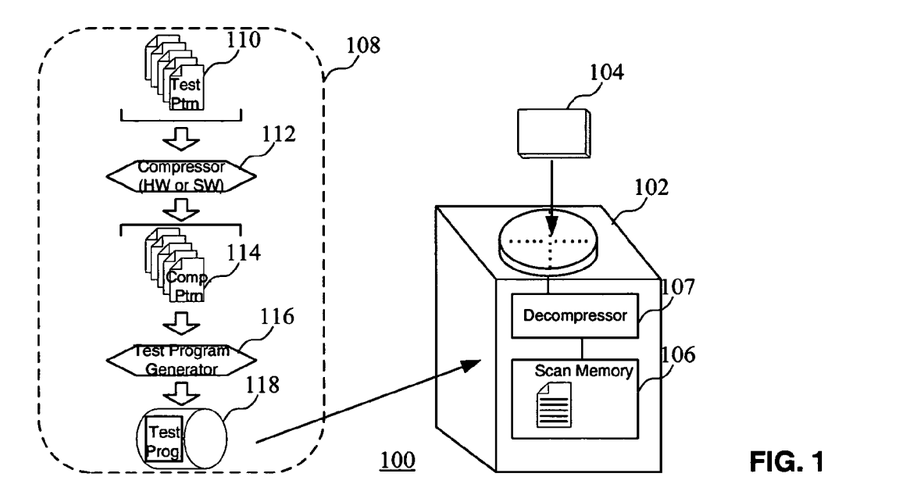
FIG. 1 is a block diagram of a device for testing an integrated circuit according to an embodiment of the present invention.

Turning first to FIG. 1, a block diagram of a device 100 for testing an integrated circuit according to an embodiment of the present invention is shown. Test equipment 102 is adapted to receive a device under test 104, such as an integrated circuit. The test equipment 102, commonly called automatic test equipment (ATE), also includes a scan memory 106 which stores test data to be applied to the device under test.

Because the test data comprises compressed test data according to an embodiment of the present invention, a decompressor 107 is coupled to the scan memory. The decompressor 107 could be implemented on a mother board or a channel card of the test equipment, for example. Placing the decompressor on a circuit board of the test equipment eliminates the need to modify existing probe cards. The decompressor could decompress data when needed, rather than decompressing the entire data pattern before applying the test data to the device under test.

The test equipment is adapted to receive test data by way of a test program generated by a test data generator 108. The test data generator 108, which could be a computer separate from the test equipment, or circuits and software associated with the test equipment 102, preferably receives test patterns 110 which are coupled to a compressor 112. The test patterns are then preferably compressed using a lossless compression system and combined into one test pattern list. The compressor could be a hardware compressor or a software compressor, which are well known in the art. The use of a compressor increases test coverage by reducing test pattern size, and therefore allowing more test patterns to fit in scan memory. The compressed pattern 114 is coupled to a test program generator 116, which outputs a test program 118 to be stored in the scan memory 106. In addition to including the compressed test pattern, the test program 118 includes additional data, such as pin information, enabling testing of the device under test when coupled to the test equipment. A specific example of generating a test program is described in more detail in reference to method of FIG. 11. An example of test equipment which could be used in an embodiment of the present invention is the J750 Tester available from Teradyne, Inc. of Boston, Mass., although other suitable test equipment could be used.

Figure 2:
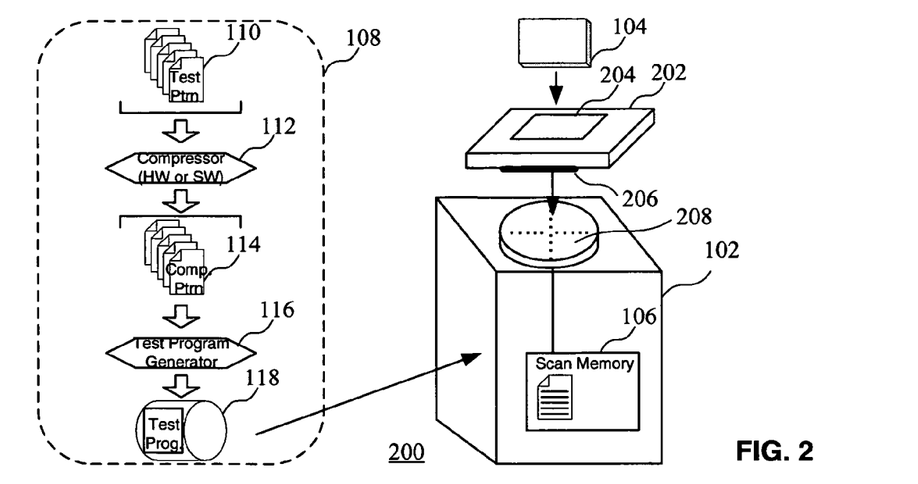
FIG. 2 is a block diagram of a device for testing an integrated circuit according to an alternate embodiment of the present invention.

As shown in the embodiment of FIG. 2, a block diagram of a device 200 for testing an integrated circuit comprises a separate decompressor attachment 202 having a first connector 204 adapted to receive a device under test and a second connector 206 to couple the decompressor attachment to a corresponding connector 208 of the test equipment. The decompressor attachment 206 could be, for example, a modified probe card having a decompressor circuit capable of decompressing data based upon a known algorithm.

Figure 3:
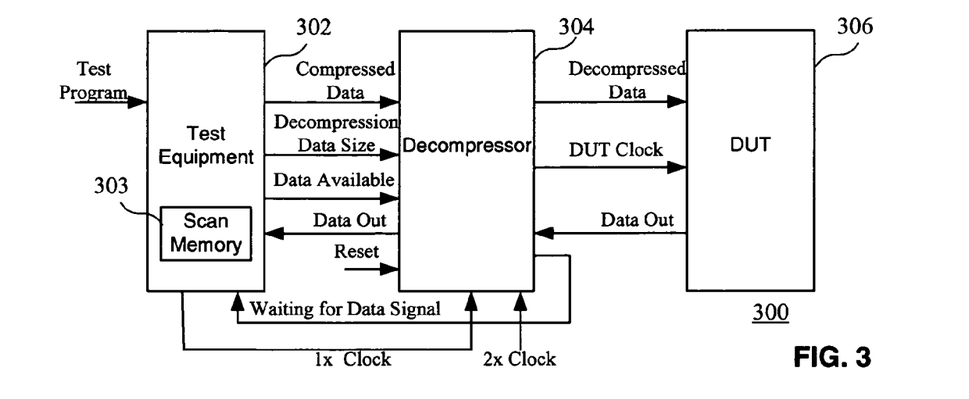
FIG. 3 is a block diagram of a circuit for testing an integrated circuit according to an embodiment of the present invention.

Turning now to FIG. 3, a block diagram of a circuit 300 for testing an integrated circuit according to an embodiment of the present invention is shown. The circuit of FIG. 3 addresses problems of conventional test equipment, which have memory limitations. That is, if the test equipment can efficiently transfer compressed test data in an increment required by the decompression algorithm, the decompressor can generate the original uncompressed test data from the compressed test data while running at the same frequency as the test equipment. Test equipment 302, comprising a scan memory 303, receives the test program having compressed data at an input, and couples compressed data to a decompressor 304. Alternatively, the compressed data could be generated internal to the test equipment. The test equipment 302 also preferably couples a Decompression Data Size signal to the decompressor to indicate the size or width of the decompressed data (e.g. 8 or 16 bits). Finally, a Data Available signal is coupled to the decompressor to inform the decompressor that compressed data is available and will be sent to the decompressor. The decompressor 304 is adapted to decompress the compressed data and output decompressed data of the specified size or width to the device under test 306.

Compressing test patterns alone dramatically reduces test pattern load times, which is a significant issue in testing higher density integrated circuits, such as FPGAs. Accordingly, the circuit of FIG. 3 having a decompressor overcomes the problems of conventional test equipment having limited memory by allowing faster testing through reduced compressed test pattern load times without adding memory to the test equipment.

However, it is possible to further increase the efficiency of a device for testing an integrated circuit by providing a faster clock signal to a decompressor and the device under test. That is, the decompressor could also receive a separate clock signal, and output a DUT clock to the device under test. The DUT clock could be based upon the test equipment clock, where the DUT clock signal could be twice as fast as the test equipment clock, for example. Alternatively, the DUT clock could be separately coupled to the decompressor, or could be generated within the decompressor. The decompressor could also couple a "Waiting for Data" signal to the test equipment indicating that the decompressor is available to receive compressed data. Finally, output data from the device under test is coupled to the test equipment by way of the decompressor. Accordingly, the circuit of FIG. 3 overcomes both problems of reduced memory and limited operating speed of conventional test equipment. By running the decompressor and the device under test at a faster clock rate, it is possible to increase the rate of testing the device under test, even though the clock rate of the test equipment may be fixed and may be slower than the decompressor or the device under test.

Figure 4:
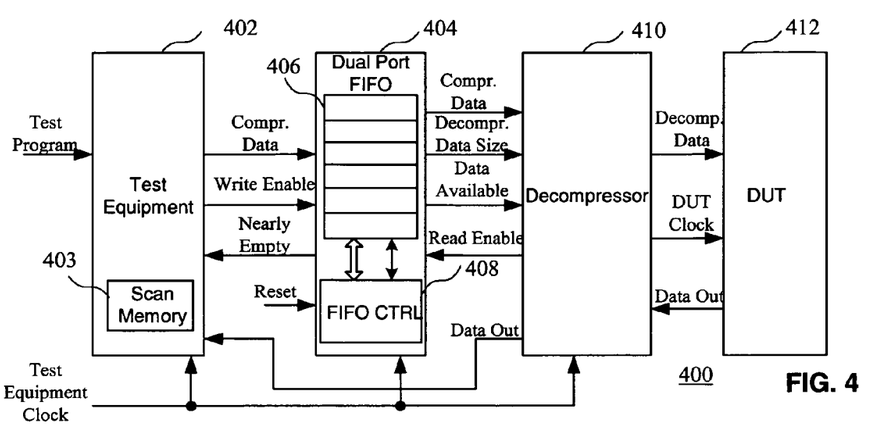
FIG. 4 is a block diagram of a circuit employing a FIFO for testing an integrated circuit according to an embodiment of the present invention.

Turning now to FIG. 4, a block diagram of a circuit 400 employing a FIFO for testing an integrated circuit according to an embodiment of the present invention is shown. Test equipment 402 receives a test program having compressed data, which is stored in a scan memory 403. A dual-port FIFO 404 has a plurality of memory locations 406 and a FIFO controller 408. The dual-port FIFO receives compressed data and a Write Enable signal at a first port, and outputs the compressed data from a second port to the decompressor 410 in response to a Read Enable signal from the decompressor. One advantage of the dual-port FIFO is that it can simultaneously receive data at one port, and output data to the decompressor using the other port. The dual-port FIFO 404 and the decompressor 410 could be incorporated in a decompressor attachment, for example. The dual-port FIFO also preferably outputs a Decompression Data Size signal to the decompressor, as described above. Finally, the dual-port FIFO preferably outputs a data available signal to the decompressor 410 when data is available, and outputs a Nearly Empty signal to the test equipment 402, which will be described in more detail below. Decompressed data output by the decompressor is coupled to the device under test 412 using a DUT clock signal. The DUT clock could be a clock having a different rate than the test equipment clock.

At the start of a test operation, the test equipment resets the FIFO controller 408, and then fills the dual-port FIFO with the first N compressed data words from scan memory. The FIFO controller uses a "Data Available" signal to indicate to the decompressor that compressed data is available, and then outputs data from the FIFO as the decompression operation proceeds. According to another aspect of the invention, the FIFO controller of the dual-port FIFO sends a Nearly Empty signal to instruct the test equipment to refill the FIFO in bursts. The FIFO controller preferably sends a Nearly Empty signal to the test equipment when FIFO data count is less than or equal to a predetermined number Y, instructing the test equipment to send a data burst (consisting of the next M-words in the test data set) to the FIFO, where M+Y is less than or equal to N.

Figure 5:
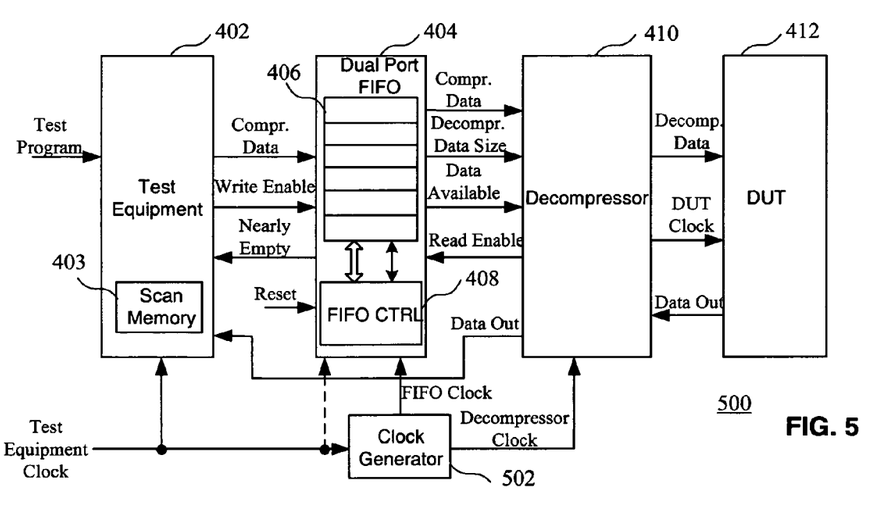
FIG. 5 is a block diagram of a circuit employing a FIFO for testing an integrated circuit according to an alternate embodiment of the present invention.
Figure 6:
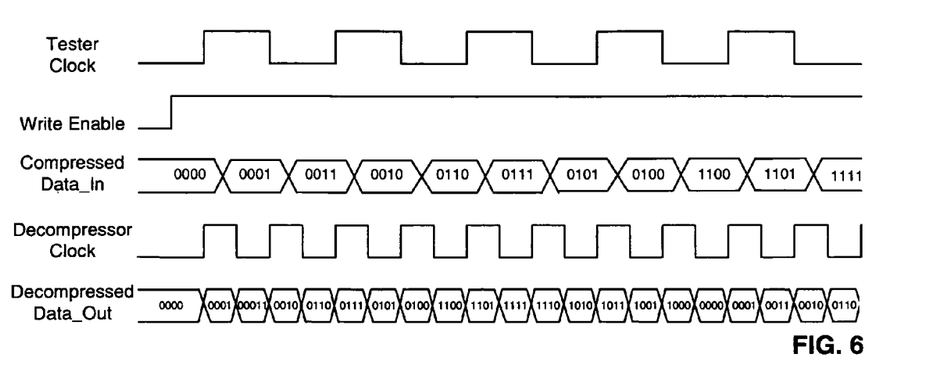
FIG. 6 is a timing diagram showing the operation of the circuit of FIG. 5 employing two clock signals according to an embodiment of the present invention.

Turning now to FIG. 5, a block diagram of a circuit employing a dual-port FIFO for testing an integrated circuit according to an alternate embodiment of the present invention is shown. According to the embodiment of FIG. 5, a clock generator 502 generates an independent decompressor clock. The clock generator 502 preferably generates a decompressor clock signal which is different from the test equipment clock, and could enable the decompressor and device under test to run asynchronous to the test equipment and dual-port FIFO. The test equipment preferably supplies a test equipment clock to the clock generator, which supplies clocks to the FIFO controller and the decompressor. The FIFO clock could have the same clock rate as the test equipment clock. Alternatively, the test equipment clock could be coupled to the FIFO (as shown by the dashed line) and a second FIFO clock signal could be coupled the FIFO from the clock generator for a FIFO adapted to receive two clock signals. The clock generator preferably generates a decompressor clock signal which would allow the decompressor and device under test to operate at a faster clock rate. As shown in the timing diagram of FIG. 6, test times are reduced by operating the decompressor at a faster clock rate than the test equipment. That is, a faster decompressor clock enables outputting the decompressed data at a faster rate, and also applying the decompressed data to the device under test at a faster rate. Accordingly, the embodiments of the present invention can effectively extend the life cycle of the existing test equipment by improving both the effective scan memory depth and the scan frequency.

Figure 7:
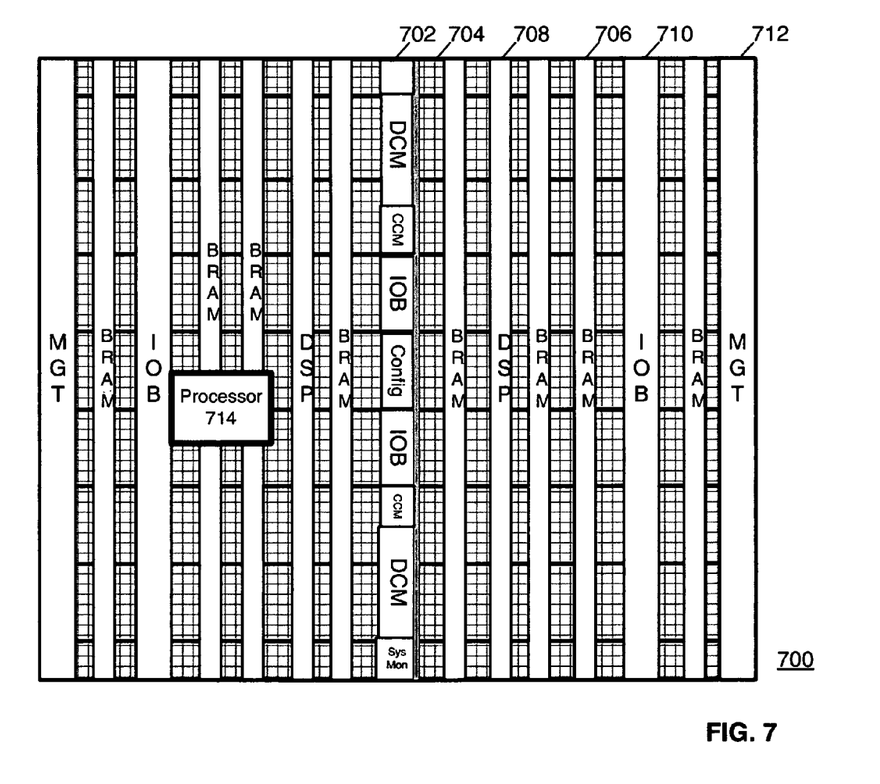
FIG. 7 is a block diagram of an integrated circuit comprising a device under test according to an embodiment of the present invention.

Turning now to FIG. 7, a block diagram of an integrated circuit comprising a device under test according to an embodiment of the present invention is shown. In particular, the circuitry of the FPGA 700 is laid out across the surface of a die as a plurality of columns of repeatable tiles. Although the majority of columns have substantially homogeneous circuits, a heterogeneous center column 702 has a variety of different circuits. For example, the circuit elements in column 702 may include a system performance monitor (SYSMON) circuit, a digital clock manager (DCM) circuit, a clock companion module (CCM) circuit, and configuration logic (CONFIG). The system performance monitor may include an analog-to-digital converter (ADC) to monitor parameters such as temperature and voltage both on-chip and off-chip. The DCM may include circuits to perform clock de-skew, clock phase shifting, clock frequency synthesis, and other clock features. The CCM may include circuits for phase-matched binary clock division and internal clock jitter & skew measurement. The configuration logic includes logic needed to address and load the configuration memory cells of the SRAM-based FPGA during configuration of the FPGA. The configuration logic in this example also may include configuration registers, boundary scan test circuitry such as JTAG circuitry, and encryption and/or decryption circuitry used to encrypt and/or decrypt bitstreams of configuration data loaded into and read out of the FPGA.

Each homogeneous column preferably has substantially identical circuit elements substantially filling the column. The substantially identical circuit elements in a column are of a particular circuit type from a group of circuit types that may include a Configurable Logic Block (CLB) type 704, a Block Random Access Memory (BRAM) type 706, a Digital Signal Processor (DSP) type 708, an Input/Output Block (IOB) type 710, and a Multi-Giga Bit Transceiver (MGT) type 712. The FPGA 700 may also comprise an embedded processor 714. In testing an FPGA according to the present invention, decompressed test data is used to configure different circuit elements of an FPGA in order to determine whether the FPGA is functioning properly. The programmable logic device could be, for example, one of the Virtex family of field programmable gate arrays available from Xilinx, Inc. of San Jose, Calif.

Figure 8:
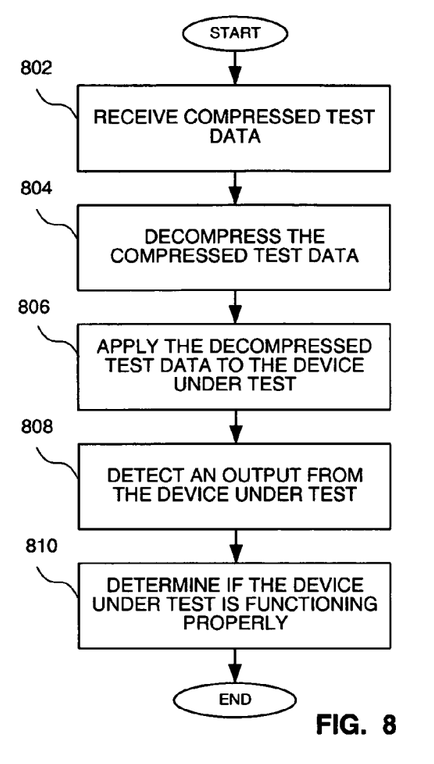
FIG. 8 is a flow chart showing a method of coupling test signals to a device under test according to an embodiment of the present invention.

Turning now to FIG. 8, a flow chart shows a method of coupling test signals to a device under test according to an embodiment of the present invention. The method of FIG. 8, as well as the methods described in FIGS. 9-11, could be implemented according to the devices and circuits of FIGS. 1-7. In particular, compressed test data is received at test equipment for testing an integrated circuit at a step 802. The compressed test data is then decompressed at a step 804. The decompressed test data is applied to the device under test at a step 806. For example, the decompressed test data could be used to instantiate a logic circuit in a programmable logic device, for example. An output from the device under test is detected at a step 808, and analyzed at a step 810 to determine if the device under test is functioning properly.

Figure 9:
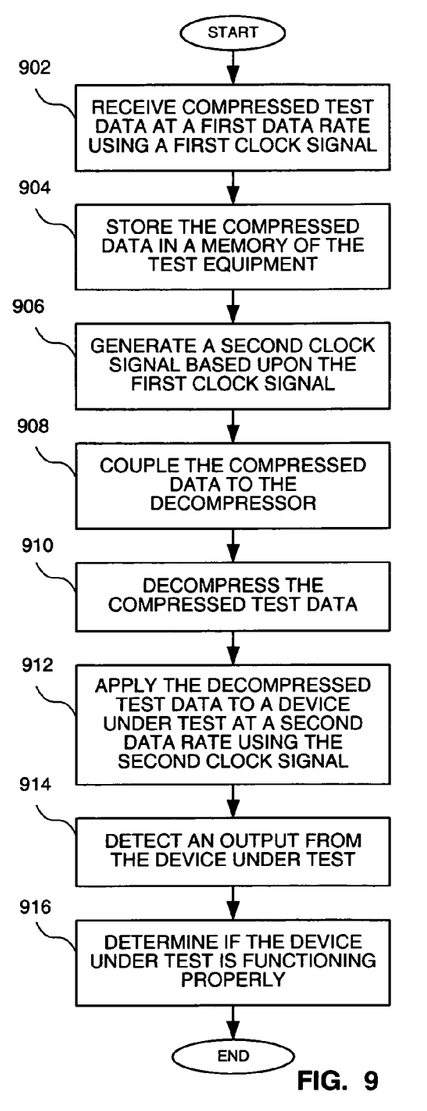
FIG. 9 is a flow chart showing a method of coupling test signals to a device under test by employing two clock signals according to an embodiment of the present invention.

Turning now to FIG. 9, a flow chart shows a method of coupling test signals to a device under test by employing two clock signals according to an embodiment of the present invention. In particular, compressed test data is received at a first data rate using a first clock signal at a step 902. The compressed data is stored in a memory of the test equipment at a step 904. A second clock signal is generated at a step 906. The second clock signal, which could be based upon the first clock signal, is preferably faster than the first clock signal. The compressed test data is coupled to a decompressor at a step 908, and decompressed using the second clock signal at a step 910. The decompressed test data is applied to a device under test using the second clock signal at a step 912. An output from the device under test is detected at a step 914, and it is then determined if the device under test is functioning properly at a step 916.

Figure 10:
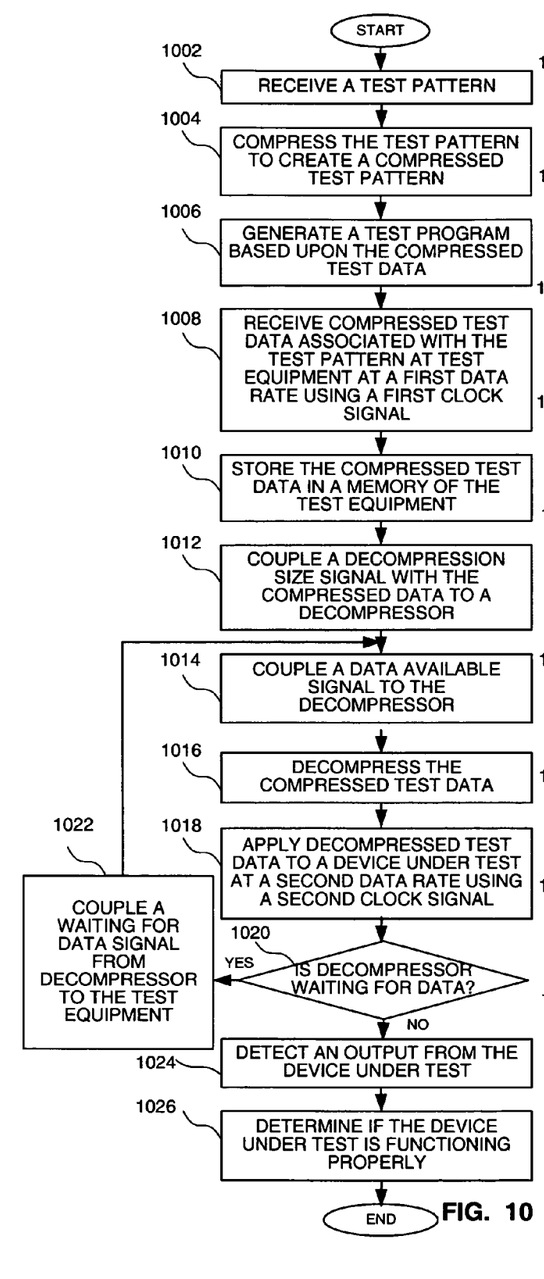
FIG. 10 is a flow chart showing a method of coupling test signals to a device under test by employing two clock signals according to an alternate embodiment of the present invention.

Turning now to FIG. 10, a flow chart shows a method of coupling test signals to a device under test by employing two test signals according to an alternate embodiment of the present invention. Test patterns are received at a step 1002. The test patterns are compressed to create a compressed test pattern at a step 1004. A test program is generated based upon the compressed test pattern at a step 1006. Compressed test data associated with the test pattern is received at test equipment at a first data rate using a first clock signal at a step 1008. The compressed test data is stored in a memory of the test equipment at a step 1010. A decompression size signal associated with the compressed data is coupled to a decompressor at a step 1012. A data available signal is also coupled to the decompressor at a step 1014.

The compressed test data is decompressed at a step 1016, and the decompressed test data is then applied to a device under test at a second data rate using a second clock signal at a step 1018. It is then determined whether the decompressor is waiting for data at a step 1020. If so, a waiting for data signal is coupled from the decompressor to the test equipment at a step 1022. If employing a FIFO, such a signal could be an Nearly Empty signal, for example. Otherwise, an output from the device under test is detected at a step 1024, and it is then determined if the device under test is functioning properly at a step 1026.

Figure 11:
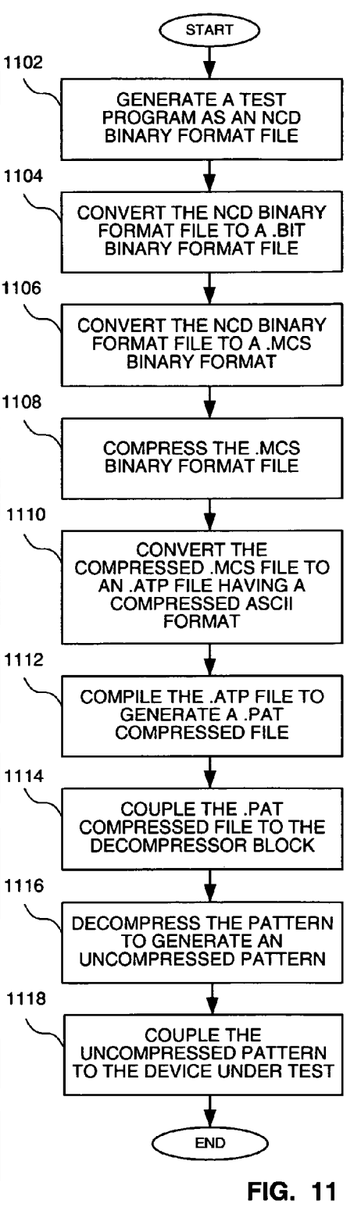
FIG. 11 is a flow chart showing a method of compressing data to couple test signals to a device under test according to an embodiment of the present invention.

Turning now to FIG. 11, a flow chart shows a method of compressing data in order to couple test signals to a device under test according to an embodiment of the present invention. A test program is generated as an NCD binary format file at a step 1102. The NCD binary format file is converted to a .bit binary format file at a step 1104. The .bit binary format file is converted to a .mcs binary format at a step 1106, which is then compressed at a step 1108. The compressed .mcs file is converted to an .atp file having a compressed ASCII format at a step 1110. The .atp file is compiled at a step 1112 to generate a .pat compressed file, which is coupled to the decompressor block at a step 1114. The pattern is decompressed to generate an uncompressed pattern at a step 1116. The uncompressed pattern is coupled to the device under test at a step 1118. Although the flow chart of FIG. 11 is given by way of example, it should be understood that other file formats could be employed according to embodiments of the present invention.

It can therefore be appreciated that the new and novel device and method of coupling test signals to a device under test has been described. It will be appreciated by those skilled in the art that numerous alternatives and equivalents will be seen to exist which incorporate the disclosed invention. As a result, the invention is not to be limited by the foregoing embodiments, but only by the following claims.

The invention claimed is:

1. A device for testing an integrated circuit, said device comprising:
   a first connector coupled to receive an integrated circuit under test;
   a second connector coupled to receive compressed test data by way of test equipment at a first clock rate based upon a first clock signal;
   a clock generator coupled to receive said first clock signal and generate a second clock signal;
   a memory of said test equipment storing said compressed test data comprising test patterns for testing the functionality of said integrated circuit under test;
   a dual-port first-in first-out memory coupled to said memory of said test equipment and providing an empty signal to said test equipment to instruct said test equipment to send words of said compressed test data to a first port of said dual-port first-in first-out memory, wherein said empty signal is sent when the dual-port first-in first-out memory data count is less than or equal to a predetermined number; and
   a decompressor associated with said test equipment and coupled to receive said compressed test data from a second port of said dual-port first-in first-out memory, said decompressor coupling a read enable signal to said dual-port first-in first-out memory to enable reading words of compressed test data from said second port and coupling decompressed test data to said integrated circuit under test at a second clock rate based upon said second clock signal.

2. A device for testing an integrated circuit, said device comprising:
   test equipment comprising a memory storing, as compressed test data, test patterns for testing the functionality of said integrated circuit under test, said test equipment being adapted to receive said integrated circuit under test;
   a dual-port first-in first-out memory coupled to said memory of said test equipment and providing an empty signal to said test equipment to instruct said test equipment to send words of said compressed test data to a first port of said dual-port first-in first-out memory, wherein said empty signal is sent when the dual-port first-in first-out memory data count is less than or equal to a predetermined number;
   a decompressor associated with said test equipment and coupled to receive said compressed test data from a second port of said dual-port first-in first-out memory at a first clock rate based upon a first clock signal and coupling a read enable signal to the dual-port first-in first-out memory to enable reading words of said compressed test data from said second port;
   a clock generator coupled to receive said first clock signal and generate a second clock signal; and
   an output coupling decompressed data, which is based upon said compressed test data, to said integrated circuit under test at a second clock rate based upon said second clock signal.

3. The device of claim 2 wherein said decompressor comprises a decompressor attachment coupled to said test equipment.

4. A device for testing an integrated circuit, said device comprising:
   test equipment comprising a memory for storing test patterns, said memory receiving compressed test data comprising test patterns for testing the functionality of an integrated circuit;
   a dual-port first-in first-out memory coupled to said memory of said test equipment and providing an empty signal to said test equipment to instruct said test equipment to send words of said compressed test data to a first port of said dual-port first-in first-out memory, wherein said empty signal is sent when the dual-port first-in first-out memory data count is less than or equal to a predetermined number;
   a decompressor attachment coupled to said test equipment, said decompressor attachment receiving said test patterns for testing the functionality of an integrated circuit from a second port of said dual-port first-in first-out memory at a first clock rate based upon a first clock signal and coupling a read enable signal to said dual-port first-in first-out memory to enable reading words of said compressed data from said second port;
   a clock generator coupled to receive said first clock signal and generate a second clock signal;
   decompressed data output by said decompressor attachment at a second clock rate based upon said second clock signal; and
   an integrated circuit under test coupled to receive said decompressed data from said decompressor attachment.

5. The device of claim 4 wherein said first clock signal is generated by said test equipment.

6. The device of claim 5 wherein said second clock signal is coupled to a decompressor circuit of said decompressor attachment.

7. The device of claim 5 wherein said second clock signal has a clock rate which is greater than said first clock signal.

8. The device of claim 7 wherein said second clock signal is coupled to said integrated circuit under test.

9. A method of coupling test signals to a device under test, said method comprising the steps of:
   receiving a test pattern for testing the functionality of an integrated circuit under test;
   compressing said test pattern to create a compressed test program;
   receiving compressed test data of said compressed test program in a memory of test equipment at a first data rate using a first clock signal;
   storing said compressed test data in said memory of said test equipment;
   coupling words of said compressed test data to a first port of a dual-port first-in first-out memory in response to an empty signal received from said dual-port first-in first-out memory, wherein said empty signal is sent when the dual-port first-in first-out memory data count is less than or equal to a predetermined number;

generating a second clock signal having a second clock rate based upon said first clock signal;

receiving words of said compressed test data from a second port of said dual-port first-in first-out memory in response to a read enable signal from a decompressor circuit;

decompressing said compressed test data to create decompressed test data;

applying said decompressed test data to said integrated circuit under test at a second data rate using said second clock signal; and detecting an output from said integrated circuit under test.

10. The method of claim 9 further comprising a step of generating a test program based upon said compressed test data.

11. The method of claim 9 further comprising a step of coupling a decompression size signal with said compressed test data to a decompressor.

12. The method of claim 11 further comprising a step of coupling a data available signal to said decompressor.

13. The method of claim 12 further comprising a step of coupling a waiting for data signal from said decompressor to said test equipment.

* * * * *